(12) United States Patent
Sugamori et al.

(10) Patent No.: US 6,631,340 B2
(45) Date of Patent: *Oct. 7, 2003

(54) APPLICATION SPECIFIC EVENT BASED SEMICONDUCTOR MEMORY TEST SYSTEM

(75) Inventors: Shigeru Sugamori, Santa Clara, CA (US); Koji Takahashi, Santa Clara, CA (US); Hiroaki Yamoto, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/981,535

(22) Filed: Oct. 15, 2001

(65) Prior Publication Data

US 2003/0074153 A1 Apr. 17, 2003

(51) Int. Cl.[7] .......................... G01M 19/00; R06F 19/00
(52) U.S. Cl. ....................................... 702/122; 365/201
(58) Field of Search ............................ 702/122, 58, 59, 702/117–120, 123–126, 183, 185, 188, 189; 365/201

(56) References Cited

U.S. PATENT DOCUMENTS

| | | | | |
|---|---|---|---|---|
| 4,759,021 A | * | 7/1988 | Kawaguchi et al. | 714/743 |
| 4,862,460 A | * | 8/1989 | Yamaguchi | 714/743 |
| 5,917,833 A | * | 6/1999 | Sato | 714/718 |
| 6,006,350 A | * | 12/1999 | Tsujii | 714/718 |
| 6,233,182 B1 | * | 5/2001 | Satou et al. | 365/200 |
| 6,247,153 B1 | * | 6/2001 | Jeon et al. | 714/718 |
| 6,314,034 B1 | * | 11/2001 | Sugamori | 365/201 |
| 6,467,056 B1 | * | 10/2002 | Satou et al. | 714/720 |

* cited by examiner

*Primary Examiner*—Marc S. Hoff
*Assistant Examiner*—Mary Catherine Baran
(74) *Attorney, Agent, or Firm*—Muramatsu & Associates

(57) ABSTRACT

A semiconductor test system for testing semiconductor devices has a plurality of different tester modules and an algorithmic pattern generator (ALPG) for generating an algorithmic pattern specific to an intended memory, thereby achieving a low cost and application specific memory test system. The semiconductor test system includes two or more tester modules whose performances are different from one another, an ALPG module for generating an algorithmic pattern which is specific to the memory, a test system main frame to accommodate a combination of the tester modules and the ALPG module, a test fixture for electrically connecting the tester modules and a device under test, a performance board provided on the test fixture for mounting the device under test, and a host computer for controlling an overall operation of the test system by communicating with the tester modules through a tester bus.

14 Claims, 14 Drawing Sheets

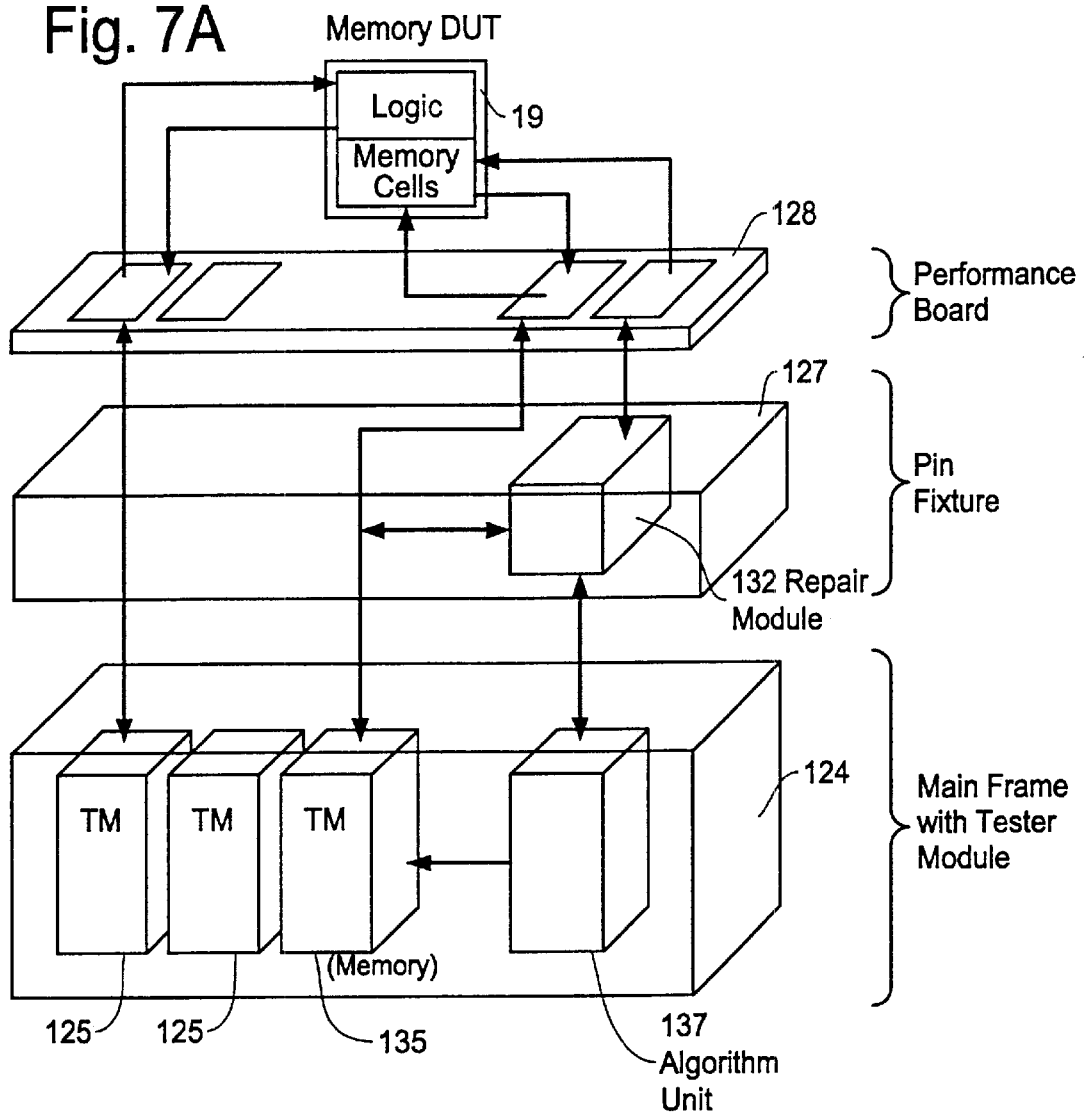

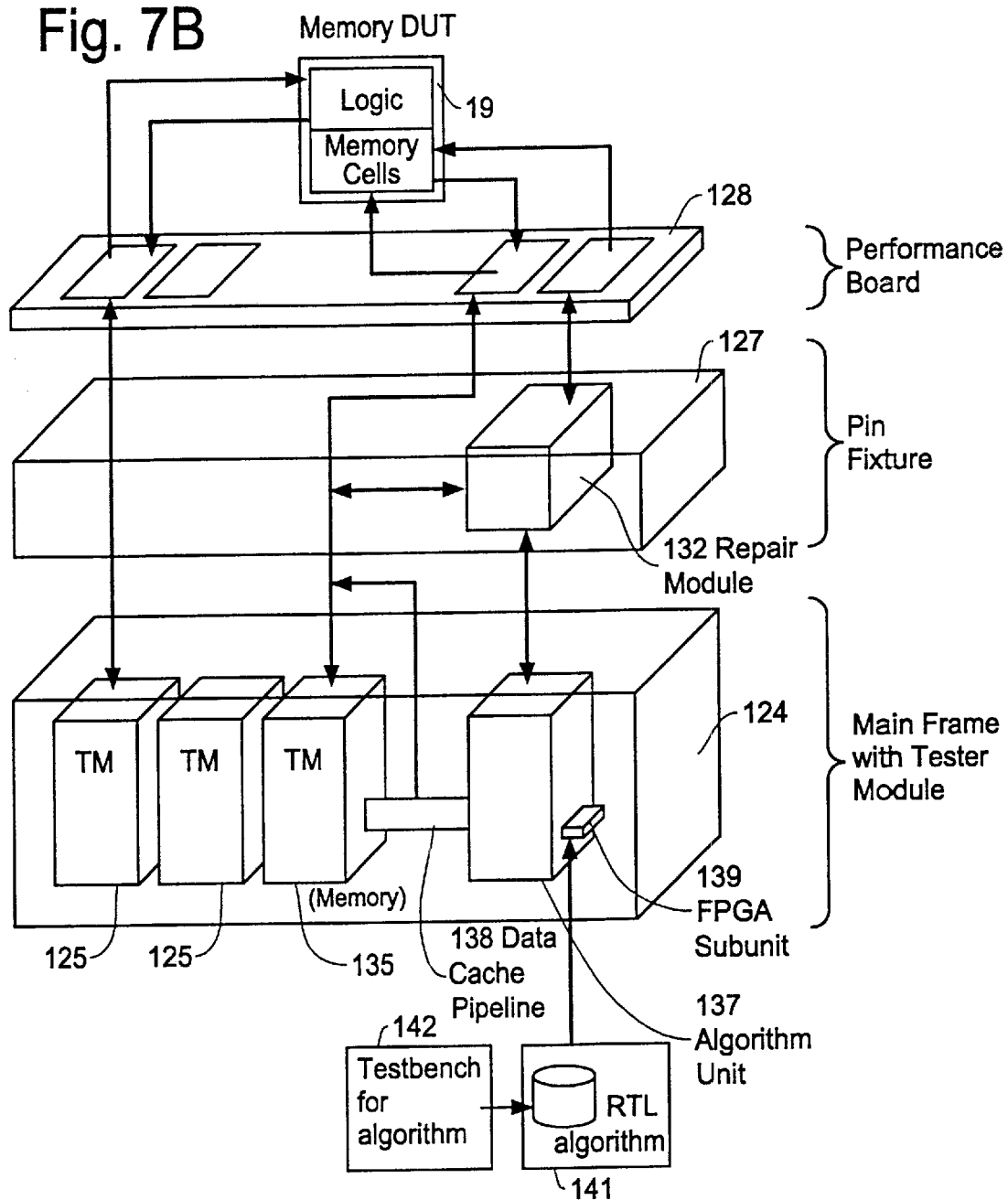

APPLICATION SPECIFIC EVENT BASED SEMICONDUCTOR MEMORY TEST SYSTEM

FIELD OF THE INVENTION

This invention relates to a semiconductor test system for testing semiconductor integrated circuits such as a large scale integrated (LSI) circuit, and more particularly, to a low cost semiconductor test system having an event based tester architecture and is configured exclusively for testing a specific type of memory devices. The event based semiconductor memory test system of the present invention is formed by freely combining a plurality of tester modules having same or different capabilities and an algorithmic pattern generation module for generating an algorithmic test pattern specific to intended memory devices to be tested, thereby establishing a low cost test system. In addition to the tester modules and algorithmic pattern generation module installed in a main frame of the test system, a function module unique to the memory under test can be installed in a test fixture, thereby forming a memory test system which can perform both memory testing and a special process associated with the memory testing.

BACKGROUND OF THE INVENTION

FIG. 1 is a schematic block diagram showing an example of a semiconductor test system, also called an IC tester, in the conventional technology for testing a semiconductor integrated circuit ("device under test" or "DUT").

In the example of FIG. 1, a test processor 11 is a dedicated processor provided within the semiconductor test system for controlling the operation of the test system through a tester bus. Based on pattern data from the test processor 11, a pattern generator 12 provides timing data and waveform data to a timing generator 13 and a wave formatter 14, respectively. A test pattern is produced by the wave formatter 14 with use of the waveform data from the pattern generator 12 and the timing data from the timing generator 13, and the test pattern is supplied to a device under test (DUT) 19 through a driver 15.

In the case where the device under test (DUT) 19 is a memory device, the test pattern applied to the DUT consists of address data, write data, and control data. After writing predetermined data in predetermined addresses of the DUT, the data in the addresses is read to determine whether the data in the memory is the same as the write data.

More particularly, the read out data from the DUT 19 is converted to a logic signal by an analog comparator 16 with reference to a predetermined threshold voltage level. The logic signal is compared with expected value data (write data) from the pattern generator 12 by a logic (pattern) comparator 17. The result of the logic comparison is stored in a failure memory 18 corresponding to the address of the DUT 19 to be used later in a failure analysis stage. In such memory testing, the address data and write data for writing and reading the memory device under test may be a pattern generated by a sequence based on mathematical algorithm. Such a pattern generation algorithm will be selected depending on a physical structure and a test purpose of a particular memory device under test.

The circuit configuration noted above is provided to each test pin of the semiconductor test system. Therefore, since a large scale semiconductor test system has a large number of test pins, such as from 256 test pins to 2048 test pins, and the same number of circuit configurations each being shown in FIG. 1 are incorporated, an actual semiconductor test system becomes a very large system. FIG. 2 shows an example of outer appearance of such a semiconductor test system. The semiconductor test system is basically formed with a main frame 22, a test head 24, and a work station 26.

The work station 26 is a computer provided with, for example, a graphic user interface (GUI) to function as an interface between the test system and a user. Operations of the test system, creation of test programs, and execution of the test programs are conducted through the work station 26. The main frame 22 includes a large number of test pins each having the test processor 11, pattern generator 12, timing generator 13, wave formatter 14 and comparator 17 shown in FIG. 1.

The test head 24 includes a large number of printed circuit boards each having the pin electronics 20 shown in FIG. 1. The driver 15, analog comparator 16 and switches (not shown) for switching the pins of the device under test are provided in the pin electronics 20. The test head 24 has, for example, a cylindrical shape in which the printed circuit boards forming the pin electronics 20 are radially aligned. On an upper surface of the test head 24, a device under test 19 is inserted in a test socket at about the center of a performance board 28.

Between the pin electronics 20 and the performance board 28, there is provided with a pin (test) fixture 27 which is a contact mechanism for transmitting electrical signals therethrough. The pin fixture 27 includes a large number of contactors such as pogo-pins for electrically connecting the pin electronics 20 and the performance board 28. As noted above, the device under test 19 receives a test pattern from the pin electronics and produces a response output signal.

In the conventional semiconductor test system, for producing a test pattern to be applied to a device under test, the test data which is described by, what is called a cycle based format, has been used. In the cycle based format, each variable in the test pattern is defined relative to each test cycle (tester rate) of the semiconductor test system. More specifically, test cycle (tester rate) descriptions, waveform (kinds of waveform, edge timings) descriptions, and vector descriptions in the test data specify the test pattern in a particular test cycle.

In the design stage of the device under test, under a computer aided design (CAD) environment, the resultant design data is evaluated by a logic simulation process through a test bench. However, the design evaluation data thus obtained through the test bench is described in an event based format. In the event based format, each change point (event) in the particular test pattern, such as from "0" to "1" or from "1" to "0", is described with reference to a time passage. The time passage is defined by, for example, an absolute time length from a predetermined reference point or a relative time length between two adjacent events.

The inventor of this invention has disclosed the comparison between the test pattern formation using the test data in the cycle based format and the test pattern formation using the test data in the event based format in the U.S. patent application Ser. No. 09/340,371. The inventor of this invention has also proposed an event based test system as a new concept test system. The detailed description on the structure and operation of the event based test system is given in the U.S. patent application Ser. No. 09/406,300, now U.S. Pat. No, 6,532,561 owned by the same assignee of this invention.

As described in the foregoing, in the semiconductor test system, a large number of printed circuit boards and the like which is equal to or greater than the number of the test pins are provided, resulting in a very large system as a whole. In the conventional semiconductor test system, the printed circuit boards and the like are identical to one another.

For example, in a high speed and high resolution semiconductor test system, such as a test rate of 500 MHz and timing accuracy of 80 picosecond, the printed circuit boards for all the test pins have the same high capabilities each being able to satisfy this test rate and timing accuracy. Thus, the conventional semiconductor test system inevitably becomes a very high cost system. Further, since the identical circuit structure is used in each test pin, the test system can conduct only limited types of test.

For example, in a semiconductor test system for testing memory devices, an algorithmic pattern generator (ALPG) for generating algorithmic test pattern to be applied to a memory under test is so configured that it can generate any types of pattern for anticipated memory devices. However, an algorithmic pattern most suitable for memory devices differs depending on types of memory device. Therefore, in the case where the types of memory to be tested are limited, such an algorithmic pattern generator results in including functions which will never be used in the test, which increases the overall cost.

Further, in the conventional semiconductor memory test system, the algorithmic pattern generator (ALPG) generates an algorithmic test pattern that is directly applied to a memory device under test. Under this situation, the test pattern must be generated at speed, i.e., the speed of actual operation speed of the memory under test. Thus, the algorithmic pattern generator (ALPG) must be designed so that it can generate the algorithmic test pattern at high speed, resulting in further increase in the cost.

Further, the algorithmic pattern generator (ALPG) used in the conventional semiconductor memory test system is so structured that the data is extracted from the instruction memory formed in the pattern generator based on the program. Thus, the algorithmic pattern generator requires times to access the instruction memory, which makes it difficult to generate the algorithmic test pattern at high speed. For generating the algorithmic test pattern at high speed, high speed memory devices must be used, which increases the cost of the pattern generator.

One of the reasons that the conventional semiconductor test system installs the identical circuit configuration in all of the test pins as noted above, and as a result, not able to conduct two or more different kinds of test at the same time by having different circuit configuration, is that the test system is configured to generate the test pattern by using the cycle based test data. In producing the test pattern using the cycle based concept, the software and hardware tend to be complicated, thus, it is practically impossible to include different circuit configurations and associated software in the test system which would make the test system even more complicated. Further, because of these reasons, it is necessary for the algorithmic pattern generator (ALPG) for memory device testing to achieve a high speed operation and to generate test patterns for all types of memory device.

To explain the above noted reasons more clearly, brief comparison is made between the test pattern formation using the test data in the cycle based format and the test pattern formation using the test data in the event based format with reference to waveforms shown in FIG. 3. The more detailed comparison is disclosed in the above noted U.S. patent applications owned by the same assignee of this invention.

The example of FIG. 3 shows the case where a test pattern is created based on the data resulted from the logic simulation conducted in the design stage of the large scale integrated circuit (LSI). The resultant data is stored in a dump file 37. The output of the dump file 37 is configured with data in the event based format showing the changes in the input and output of the designed LSI device and having descriptions 38 shown in the lower right of FIG. 3 for expressing, for example, the waveforms 31 such as VCD (Value Change Dump) of Verilog.

In this example, it is assumed that test patterns such as shown by the waveforms 31 are to be formed by using such descriptions above. The waveforms 31 illustrate test patterns to be generated at pins (tester pins or test channels) Sa and Sb, respectively. The event data describing the waveforms is formed of set edges San, Sbn and their timings (for example, time lengths from a reference point), and reset edges Ran, Rbn and their timings.

For producing a test pattern to be used in the conventional semiconductor test system based on the cycle based concept, the test data must be divided into test cycles (tester rate), waveforms (types of waveforms, and their edge timings), and vectors. An example of such descriptions is shown in the center and left of FIG. 3. In the cycle based test pattern, as shown by waveforms 33 in the left part of FIG. 3, a test pattern is divided into each test cycle (TS1, TS2 and TS3) to define the waveforms and timings (delay times) for each test cycle.

An example of data descriptions for such waveforms, timings and test cycles is shown in timing data (test plan) 36. An example of logic "1", "0" or "Z" of the waveforms is shown in vector data (pattern data) 35. For example, in the timing data 36, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge of the corresponding test cycle.

As in the foregoing, because the conventional semiconductor test system produces a test pattern under the cycle based procedure, the hardware structures in the pattern generator, timing generator, and wave formatter tend to be complicated, and accordingly, the software (test data) to be used in such hardware becomes complicated as well. Further, since all of the test pins (such as Sa and Sb in the above example) are defined by the common test cycle, it is not possible to generate test patterns of different cycles among the test pins at the same time.

Therefore, in the conventional semiconductor test system, the same circuit configurations are used in all of the test pins, and it is not possible to incorporate printed circuit boards of different circuit structures therein. As a consequence, it is not possible to perform different test such as the analog block test and the digital block test at the same time in a parallel fashion. Moreover, for example, a high speed type test system also needs to include a low speed hardware configuration (such as high voltage and large amplitude generation circuit and a driver inhibit circuit, etc.), thus, the high speed performance cannot be fully improved in such a test system.

In contrast, for producing a test pattern by using the event based method, it is only necessary to read set/reset data and associated timing data stored in an event memory, requiring very simple hardware and software structures. Further, each test pin can operate independently as to whether there is any event therein rather than the test cycle and various types of associated data, thus, test patterns of different functions and frequency ranges can be generated at the same time.

As noted in the foregoing, the inventor of this invention has proposed the event based semiconductor test system. In the event based test system, since the hardware and software involved are very simple in the structure and contents, it is possible to formulate an overall test system having different hardware and software among the test pins therein. Moreover, since each test pin can operate independently from the other, two or more tests which are different in functions and frequency ranges from one another can be carried out in a parallel fashion at the same time. Since an event based test system has high flexibility, it is possible to test a memory block and a logic block in the device under test at the same time. Further, it is possible to establish a low cost event based memory test system which is specific to a type of memory devices to be tested and to a test purpose.

SUMMARY OF THE INVENTION

Therefore, it is an object of the present invention to provide a semiconductor test system which is dedicated to a specific application by having tester modules of different capabilities corresponding to test pins and a function module to be used for the specific application in a test fixture.

It is another object of the present invention to provide a semiconductor test system which is capable of testing different functional cores in a system IC (system-on-chip) having such as a processor core and a memory core in parallel at the same time by having an arbitrary combination of logic tester modules and memory tester modules corresponding to test pins.

It is a further object of the present invention to provide a simple and low cost semiconductor memory test system which can be configured depending on a type of memory device under test or a test purpose by incorporating tester modules of different capabilities corresponding to test pins and an algorithmic pattern generator module designed for a specific application.

It is a further object of the present invention to provide a simple and low cost semiconductor memory test system which can be configured depending on a type of memory device under test or a test purpose by incorporating tester modules of different capabilities corresponding to test pins, an algorithmic pattern generator module designed for a specific application, and a function module having a specific relationship with the memory device under test.

It is a further object of the present invention to provide a simple and low cost semiconductor memory test system which can be configured depending on a type of memory device under test or a test purpose by incorporating tester modules of different capabilities corresponding to test pins and an algorithmic pattern generator module configured by a programmable logic device such as a field programmable gate array (FPGA).

It is a further object of the present invention to provide a semiconductor memory test system having tester modules of different capabilities corresponding to test pins wherein interface specification between the test system main frame and the tester modules is standardized for freely accommodating tester modules of different pin counts and performances in the main frame.

It is a further object of the present invention to provide a semiconductor test system which can test a semiconductor device under test at low cost and further enhance its ability to meet the future needs.

The semiconductor memory test system of the present invention includes two or more tester modules whose performances are different from one another, an algorithmic pattern generator (ALPG) module for generating an algorithmic pattern specific to a memory device under test, a test system main frame for installing a combination of two or more tester modules and ALPG module therein, a test fixture provided on the test system main frame for electrically connecting the tester modules and a device under test, a function module provided in the test fixture for performing a function specific to the memory device under test and associated with the test result of the memory device under test, and a host computer for controlling an overall operation of the test system by communicating with the tester modules and the ALPG module through a tester bus.

The semiconductor memory test system of the present invention utilizes the ALPG module which is designed to generate only the algorithmic pattern necessary for the specific memory device or test purpose. Accordingly, in the present invention, various combinations of tester module and ALPG module can be selectively formed, thereby establishing a low cost test system which is specific to an intended memory device under test.

In the semiconductor memory test system of the present invention, the function module is provided in the test fixture which electrically connects the tester module and the device under test, and such a test fixture is replaced with other test fixture based on the device to be tested or intended purpose. The tester module consists of a plurality of tester boards where, under the control of the host computer, each tester board provides a test pattern to a corresponding device pin and evaluates a response output of the device under test.

In the event based memory test system of the present invention, the function module exclusively designed for specific application is installed in the test fixture (pin fixture). Thus, the test system can achieve the function which is specific to the memory device under test as well as the function which is associated with the test result, such as the repair of the memory cells in the memory device under test. As a consequence, by replacing the test fixture depending on the memory device under test, a semiconductor memory test system of simple structure and low cost can be achieved.

In the semiconductor memory test system of the present invention, each test pin can operate independently from the other. Thus, two or more test pin groups can perform the test for different devices or different blocks in the device in parallel at the same time. Accordingly, a plurality of different functional blocks (cores) in a system-on-chip IC, such as a logic core and a memory core, can be tested in parallel at the same time.

Since the semiconductor test system of the present invention has a modular structure, a desired test system can be formed freely depending on the kind of devices to be tested and the purpose of the test. Further, the hardware of the event based test system can be dramatically reduced while the software for the test system can be dramatically simplified. Accordingly, the tester modules of different capabilities and performances can be installed together in the same test system. Furthermore, an overall physical size of the event based test system can be considerably reduced, resulting in further cost reduction, floor space reduction and associated cost savings.

BRIEF DESCRIPTION OF THE DRAWINGS

FIG. 7A is a block diagram showing an example of semiconductor test system configured for testing a semiconductor device having a memory therein, and FIG. 7B is a block diagram showing another example of semiconductor test system configured for testing a semiconductor device having a memory therein.

DETAILED DESCRIPTION OF THE PREFERRED EMBODIMENT

Figure 1:
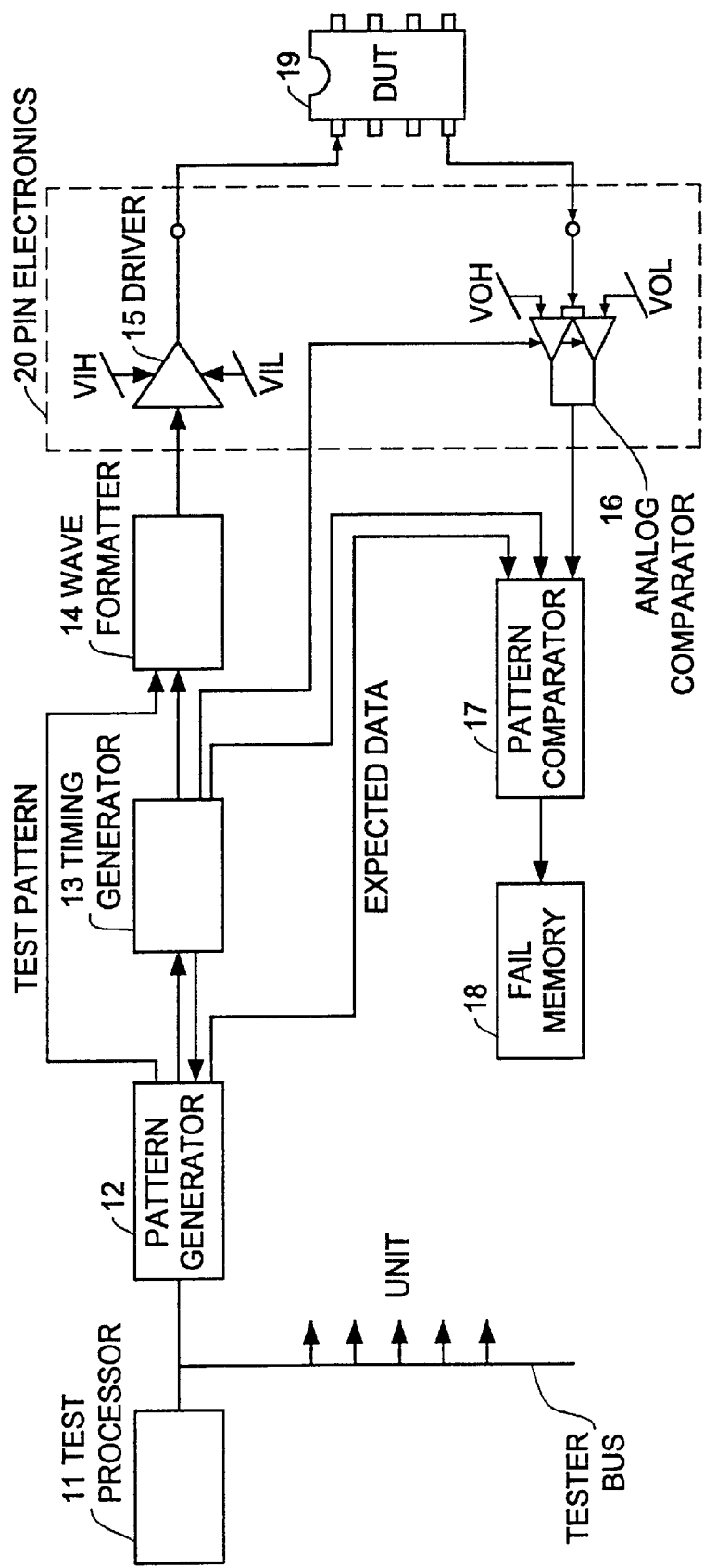
FIG. 1 is a block diagram showing a basic configuration of a semiconductor test system (LSI tester) in the conventional technology.
Figure 2:
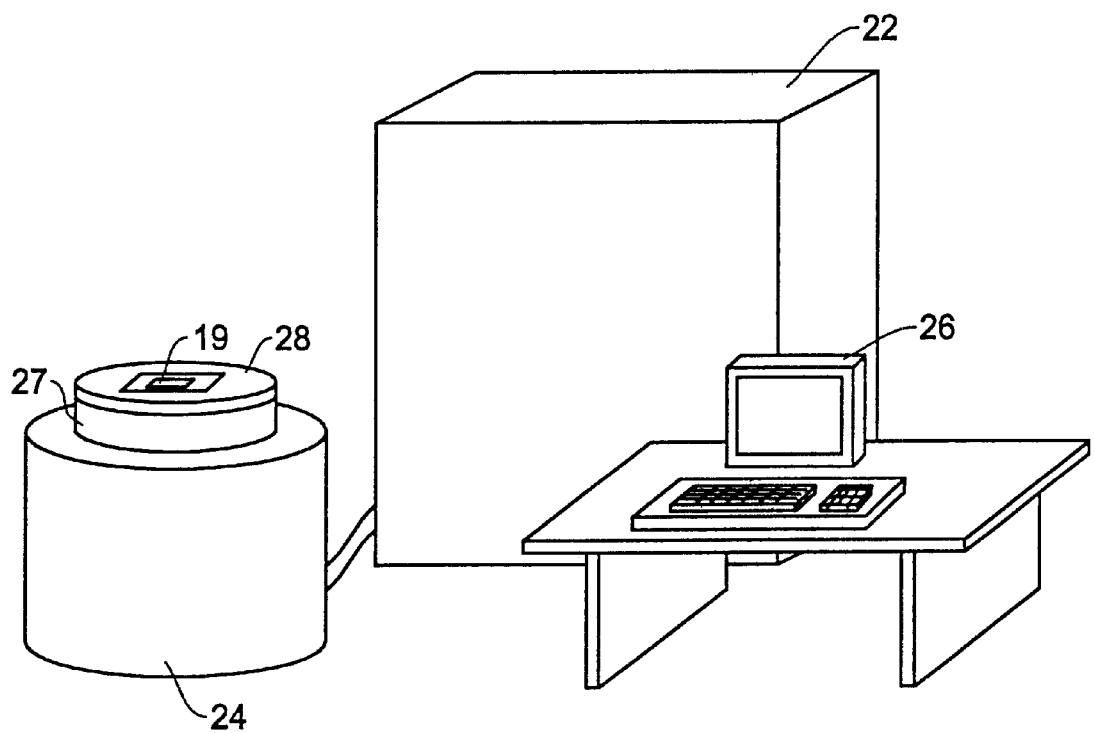
FIG. 2 is a schematic diagram showing an example of outward appearance of a semiconductor test system in the conventional technology.
Figure 3:
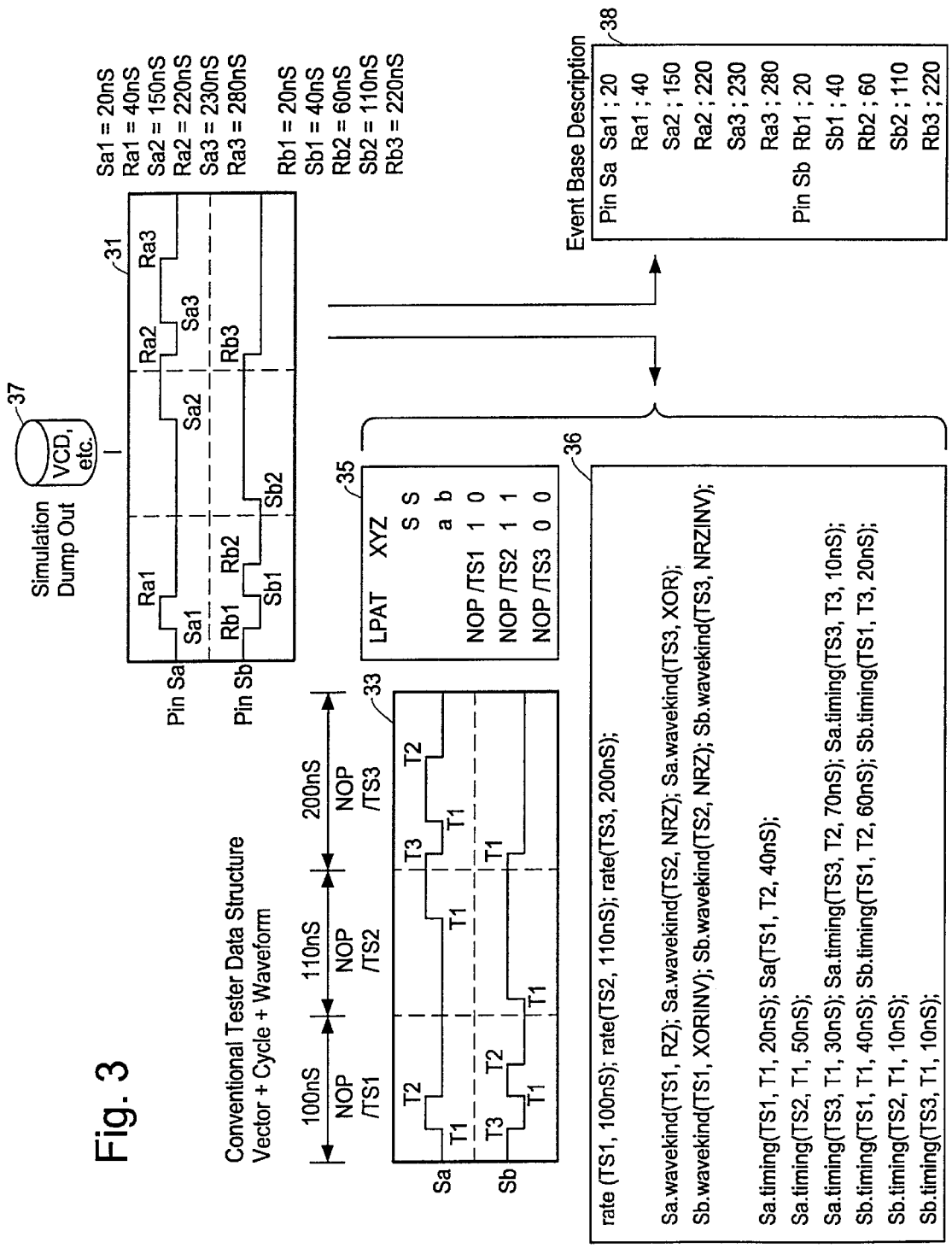
FIG. 3 is a diagram for comparing an example of descriptions for producing a cycle based test pattern in the conventional semiconductor test system with an example of descriptions for producing an event based test pattern in the semiconductor test system of the present invention.
Figure 4:
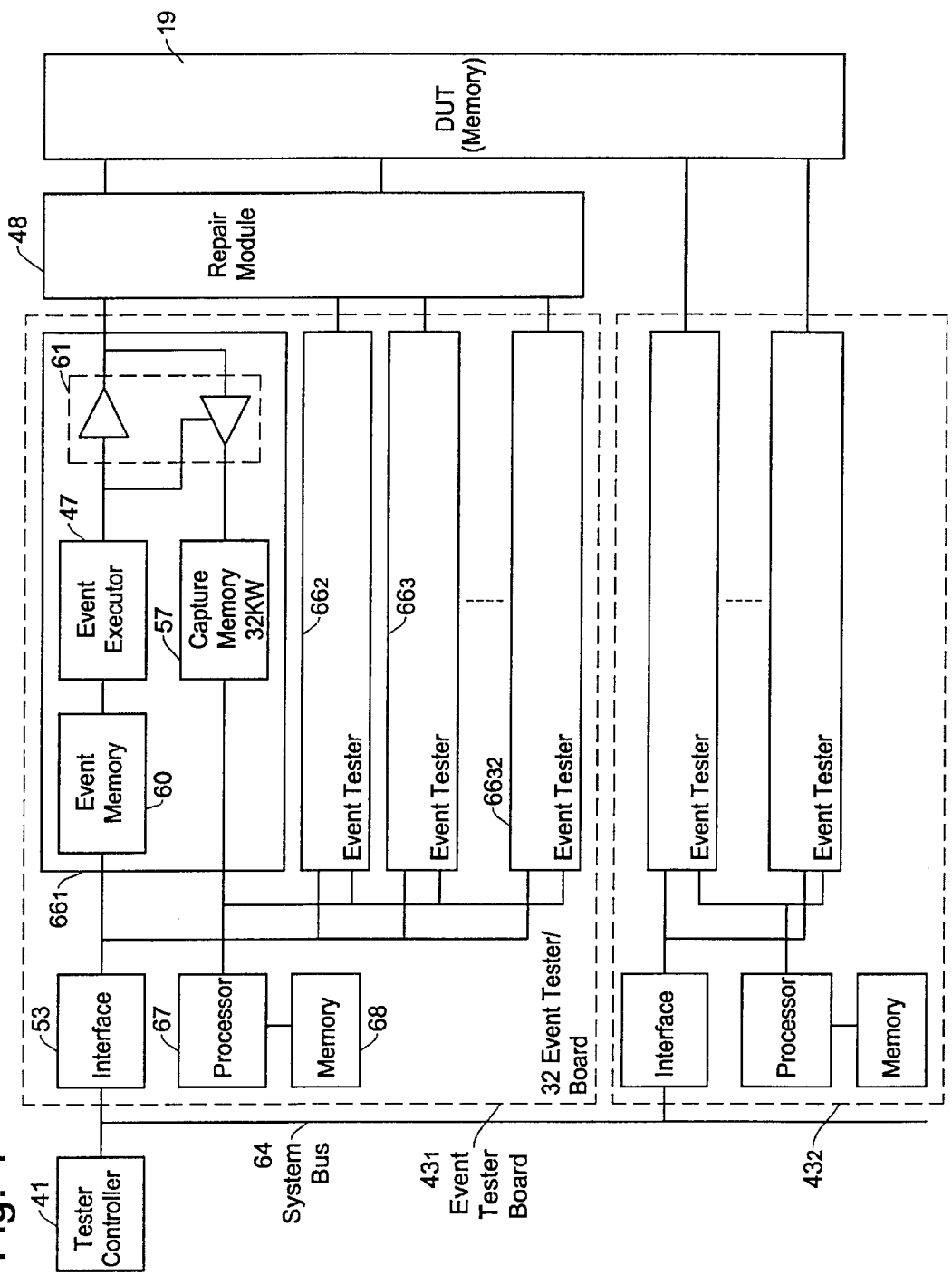
FIG. 4 is a block diagram showing an example of test system configuration for testing a memory device by an application specific event based memory test system of the preset invention.

The embodiment of the present invention is explained with reference to FIGS. 4–15. FIG. 4 is a block diagram showing a basic structure of the semiconductor test system of the present invention for testing a semiconductor device having a memory block and a logic block therein. In this example, it is assumed that the memory block in the semiconductor device under test has a repair capability in which redundant memory cells can be replaced with defective memory cells thereby recovering the memory block even when there exist defective memory cells.

In the semiconductor test system of the present invention, a test head (tester main frame) is so configured that one or more modular testers (hereinafter "tester modules") are selectively installed therein. The tester modules to be installed can be a plurality of same tester modules depending on the number of tester pins desired or a combination of different tester modules such as a high speed module HSM and a low speed module LSM. For a device under test which needs memory testing, a tester module 135 specially arranged for the memory testing may also be included in the test system as shown in FIG. 7.

As will be explained with reference to FIG. 6 later, each tester module is provided with a plurality of event tester boards 43, for example, eight (8) tester boards. Further, each event tester board includes a plurality of event testers 66 corresponding to a plurality of tester pins, such as 32 event testers for 32 tester pins. Therefore, in the example of FIG. 4, an event tester board $43_1$ deals with a memory block of the device test while other event tester boards 43 cover a logic block of the device test.

In the test system of FIG. 4, the plurality of event tester boards 43 are controlled by a tester controller 41, which is a host computer of the test system, through a system bus 64. As noted above, for example, eight event tester boards 43 may be installed in one tester module. Although not shown in FIG. 4, typically, a test system of the present invention is configured by two or more such tester modules as shown in FIG. 6.

In the test system of FIG. 4, the event tester board 43 applies a test pattern (test signal) to a device under test 19, and examines a response signal from the device under test resulted from the test pattern. In this example, for replacing memory cells in a redundant memory section of the memory under test with defective memory cells in the memory under test based on the test results, a repair module 48 is provided in the test system. As will be described later, such a function module like the repair module 48 is installed in a test fixture (pin fixture) of the test system.

Each event tester board 43 includes event testers $66_1$–$66_{32}$ for 32 channels for example, an interface 53, a processor 67 and a memory 68. Each event tester 66 corresponds to a tester pin, and has the same inner structure as that of the other within the same tester board. In this example, the event tester 66 includes an event memory 60, an event execution unit 47, a driver/comparator 61 and a test result memory 57.

The event memory 60 stores event data for producing a test pattern. The event execution unit 47 produces the test pattern based on the event data from the event memory 60. The test pattern is supplied to the device under test (DUT) 19 through the driver/comparator 61. In the case where a test pattern for the memory block of the device under test is an algorithmic sequence, an algorithmic pattern generator (ALPG) module (FIG. 7) is employed in the system. Thus, the ALPG module provides event data to the event memory 60 for generating the algorithmic test pattern.

Figure 5:
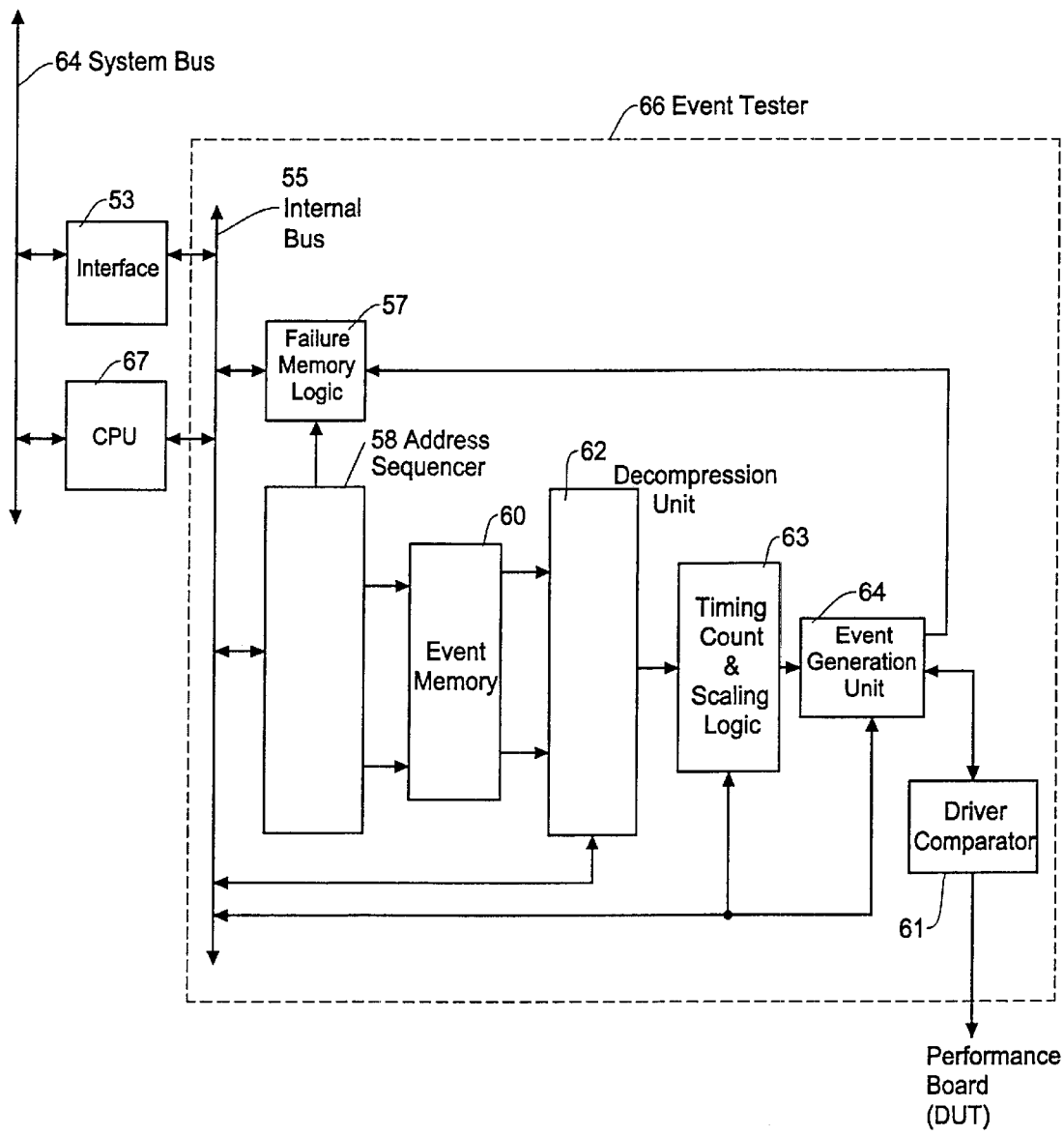
FIG. 5 is a block diagram showing an example of circuit configuration in an event tester provided in an event tester board which is incorporated in a tester module in accordance with the present invention.

FIG. 5 is a block diagram showing an example of configuration in the event tester 66 in the event tester board 43 in more detail. The further detailed description regarding the event based test system is given in the above U.S. patent application Ser. No. 09/406,300, now U.S. Pat. No. 6,532,561 as well as U.S. patent application Ser. No. 09/259,401, now U.S. Pat. No. 6,360,343 owned by the same assignee of this invention. In FIG. 5, the blocks identical to that of FIG. 4 are denoted by the same reference labels.

The interface 53 and the processor 67 are connected to the tester controller or host computer 41 (FIG. 4) through the system bus 64 to control the event tester 66 through an interface bus 55. The interface 53 is used, for example, for transferring data from the tester controller 41 to a register (not shown) in the event tester board to assign the event tester to the input/output pins of the device under test. For example, when the host computer 41 sends a group assigning address to the system bus 64, the interface 53 interprets the group assigning address and allows the data from the host computer to be stored in the register in the specified event tester board.

The processor 67 is provided, for example, in each event tester board 43, and controls the operations in the event tester board 43 including generation of events (test patterns), evaluation of output signals from the device under test, and acquisition of failure data. The processor 67 can be provided at each tester board or every several tester boards. Further, the processor 67 may not always necessary be provided in the event tester board 43, but the same control functions can be made directly by the tester controller 41 to the event tester boards.

An address controller 58 is, for example, in the most simple case, a program counter. The address controller 58 controls the address supplied to the failure data memory 57 and the event memory 60. The event timing data is transferred to the event memory 60 from the host computer as a test program and stored therein.

The event memory 60 stores the event timing data as noted above which defines timing of each of the events (change points from "1" to "0" and from "0" to "1"). For example, the event timing data is stored as two types of data, one of which shows integer multiples of a reference clock cycle while the other shows fractions of the reference clock cycle. Preferably, the event timing data is compressed before being stored in the event memory 60.

In the example of FIG. 5, the event execution unit 47 in FIG. 4 is configured with a decompression unit 62, a timing count/scaling logic 63, and an event generator 64. The decompression unit 62 decompresses (reproduces) the compressed timing data from the event memory 60. The timing count/scaling logic 63 produces time length data of each event by summing or modifying the event timing data. The time length data expresses the timing of each event by a time length (delay time) from a predetermined reference point.

The event generator 64 produces a test pattern based on the time length data and provides the test pattern to the device under test (DUT) 19 through the driver/comparator 61. Thus, a particular pin of the device under test (DUT) 19 is tested by evaluating the response output therefrom. The driver/comparator 61 is mainly formed with, as shown in FIG. 4, a driver which drives the test pattern to be applied to the particular device pin and a comparator which determines a voltage level of an output signal of a device pin resultant from the test pattern and compares the output signal with the expected logic data.

In the event tester summarized above, the input signal applied to the device under test and the expected signal compared with the output signal of the device under test are produced by the data in the event based format. In the event based format, the information of change points on the input signal and expected signal is formed of action information (set and/or reset) and time information (time length from a specified point).

As noted above, in the conventional semiconductor test system, the cycle based method has been used, which requires memory capacity smaller than that required in the event based architecture. In the cycle based test system, the time information of the input signal and expected signal is formed of cycle information (rate signal) and delay time information. The action information of the input signal and expected signal is formed of waveform data and pattern data. In this arrangement, the delay time information can be defined only by the limited number of data. Further, to generate the pattern data with flexibility, the test program must includes many loops, jumps, and/or subroutines therein. Therefore, the conventional test system requires complicated structures and operational procedures.

In the event based test system, such complicated structures and operational procedures of the conventional cycle based test system are unnecessary, thereby easily increasing the number of test pins and/or incorporating the test pins of different performances in the same test system. Although the event based test system requires a memory of large capacity, such an increase in the memory capacity is not a major problem since the increase in the memory density and the decrease in the memory cost are rapidly and continuously achieved today.

As in the foregoing, in the event based test system, each of the test pins or each group of the test pins can independently perform a test operation from the other. Consequently, in the case where a plurality of different kinds of test have to be performed, such as in testing a system-on-chip IC which has a plurality of functional blocks (cores) such as a logic core and a memory core, such different kinds of test can be conducted in a parallel fashion at the same time. Further, start and end timings of such different kinds of test can be independently established.

Figure 6:
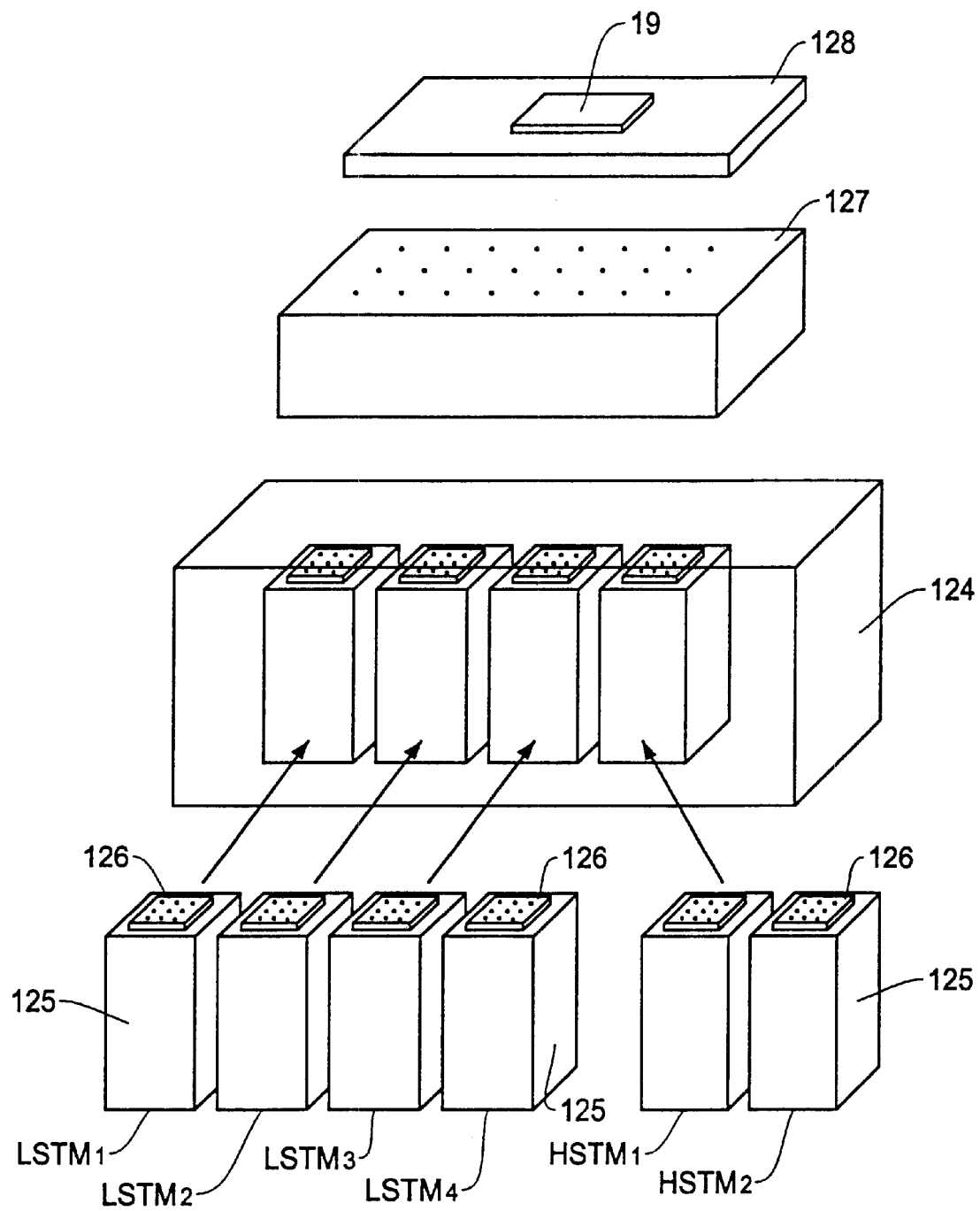
FIG. 6 is a schematic diagram for establishing a semiconductor test system having test pins grouped into different performances by incorporating a plurality of tester modules of the present invention.

FIG. 6 is a schematic diagram for establishing a semiconductor test system having test pins grouped into different performances by incorporating a plurality of tester modules of the present invention.

A test head 124 is provided with a plurality of tester modules depending on, for example, the number of pins of a test fixture 127 connected to the test head, a type of device to be tested, and the number of pins of the device to be tested. As will be described later, an interface (connection) specification between the test fixture 127 and the tester module is standardized so that any tester modules can be installed in any positions in the test head (system main frame).

The test fixture 127 includes a large number of elastic connectors such as pogo-pins to electrically and mechanically connect the tester modules and a performance board 128. The device under test 19 is inserted in a test socket on the performance board 128, thereby establishing an electrical communication with the semiconductor test system. Although not shown in FIG. 6 but is shown in FIGS. 7A and 7B, in the present invention, a function module which is specific to the intended test (such as a repair module 48 for memory repair) is installed in the test fixture 127. Therefore, the test fixture 127 in the present invention is designed unique to the specific test application such as a type of devices to be tested.

A performance board 128 is provided on the test fixture 127. A device under test (DUT) 19 is inserted, for example, in a test socket on the performance board 128, thereby establishing electrical communication with the semiconductor test system. As mentioned above, the memory repair module 48 such as shown in FIG. 4 is installed in the test fixture, however, it also can be mounted on the performance board 128 in a manner similar to the device under test (DUT) 19.

The repair module 48 is provided with data regarding the structure of the redundant memory section in the memory device under test. In the case where defect is found in a memory cell in the memory device under test as a result of the memory test, the repair module 48 recovers the memory device under test by replacing the defective memory cell with a memory cell in the redundant memory section. Thus, the repair module 48 determines an effective process to replace the memory cells and execute the repair process. Typically, such a repair process is performed by cutting circuit patterns in the memory device based on the predetermined rule specified for the memory device. Since the repair process for a specific memory device under test involves cutting circuit patterns by electric pulses, it is preferable that the memory repair module 48 includes a driver for generating such electric pulses.

Each of the tester modules 125 has a predetermined number of pin groups. For example, one high speed module HSM installs printed circuit boards corresponding to 128 test pins (test channels) while one low speed module LSM installs printed circuit boards corresponding to 256 test pins. These numbers are disclosed only for an illustration purpose, and various other numbers of test pins are also possible.

As noted above, each printed circuit board in the tester module has event testers which generates test patterns and applies the same to the corresponding pin of the device under test 19 through the performance board 128. Output signals of the device under test 19 responsive to the test pattern are transmitted to the event tester board in the tester module through the performance board 128 whereby being compared with the expected signals to determine the pass/fail of the device under test.

Each tester module is provided with an interface (connector) 126. The connector 126 is so arranged to fit to the standard specification of the test fixture 127. For example, in the standard specification of the test fixture 127, a structure of connector pins, impedance of the pins, distance between the pins (pin pitch), and relative positions of the pins are specified for the intended test head. By using the interface (connector) 126 which matches the standard specification on all of the tester modules, test systems of various combinations of the tester modules can be freely established.

Because of the configuration of the present invention, a test system of optimum cost performance which matches the device under test can be established. Further, improvement of the performance of the test system can be achieved by replacing one or more test modules, thus, an overall life time of the test system can be increased. Moreover, the test system of the present invention can accommodate a plurality of test modules whose performances are different from the other, and thus, the desired performance of the test system can be achieve directly by the corresponding test modules. Therefore, the performance of the test system can be easily and directly improved.

FIGS. 7A and 7B are block diagrams showing examples of semiconductor test system configured for testing memory devices. In the example of both FIGS. 7A and 7B, the test system is so configured that a logic block and a memory block in the device under test are tested at the same time. Also in the example of FIGS. 7A and 7B, a repair module 132 is provided in the test fixture 127. Such a function module is selected based on a specific feature of the memory device under test. Accordingly, in the case where the memory device under test does not have a redundant memory for repair, a test fixture without having a repair module 132 is used in the test system. For simplicity of illustration, the interface 126 in FIG. 6 is not shown here. Further, the tester modules 125 are simply denoted by TM, although each of which may be the same or different from one another depending on the purpose of the test.

In the semiconductor test system of FIG. 7A, the test system includes tester modules 125 for logic testing, a tester module 135 for memory testing, and an algorithmic pattern generator (ALPG) module 137. These modules are installed freely in slots provided in the main frame of the system through the interface 126 designed based on the standardized interface specification. In the case where the memory device under test has a redundant design for the purpose of repair, the test system is able to perform a memory test process as well as a memory device repair process by incorporating the test fixture 127 having the memory repair module therein.

As noted above, in this example, the tester module 125 is used for the logic testing and the tester module 135 is used for the memory testing. Basically, it is not necessary to employ different tester modules for the logic testing or memory testing. However, since the requirements in the memory testing and logic testing are different from each other, using the tester module specifically designed for the memory testing or the logic testing is effective in achieving the higher cost performance.

A test pattern generated by the tester module 125 is provided to the logic block of the device under test 19 through the test fixture 127 and the performance board 128. An output signal produced by the logic block of the device under test (DUT) 19 in response to the test pattern is compared by the expected value pattern by the tester module 125 to determine pass/fail of the output signal. A memory test pattern generated by the tester module 135 is provided to the memory block of the device under test 19 through the test fixture 127 and the performance board 128. The data stored in the memory block is read out and compared by the expected value pattern by the tester module 135 to determine pass/fail of the particular memory location in the device under test 19.

When using a test pattern having a specific mathematical sequence (algorithmic test pattern) for testing the memory block of the device under test 19, the ALPG module 137 provides event data for generating the algorithmic test pattern to the tester module 135. The ALPG module 137 is designed to produce the event data necessary only for generating the algorithmic pattern for limited types of memory device, thereby achieving low cost and small size. Under this arrangement, the algorithmic pattern in the form of event data sequence is generated by the tester module 135 to be used for the particular memory device under test.

Figure 8:
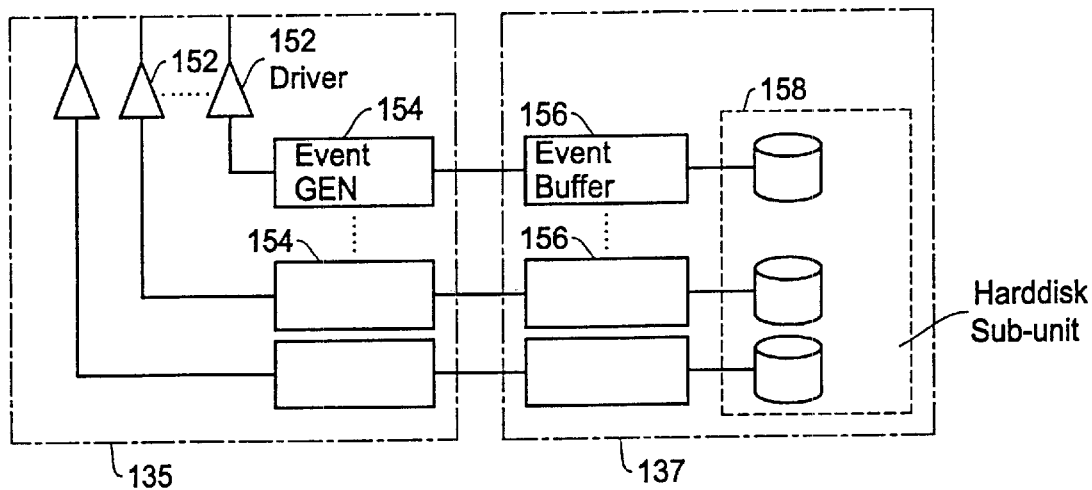
FIG. 8 is a block diagram showing a structure for supplying event data to a tester module for generating an algorithmic pattern by the ALPG module.

Here, an example of structure is described for supplying the event data from the ALPG module 137 to the tester module 135 for generating the algorithmic pattern. The block diagram of FIG. 8 shows an example of structure for such a purpose. The ALPG module 137 stores the algorithmic pattern in the event format. An example of data storage is a hard disc of several giga-bytes or several ten giga-bites (or several hundred giga-bytes in the future) in storage capacity. It is possible to configure a plurality of small hard discs in a hard disc sub-unit in such a way that each small hard disc corresponds to a test pin of the test system. Alternatively, the number of small hard discs may be smaller than that of the test pins of the test system. Although the algorithmic pattern requires a large storage capacity, since increase in the storage capacity and decrease in the size in the hard disc are realized rapidly today, data increase in the future can be easily accommodated by this structure.

The event data from the hard disc is transmitted to the event generator 154 (corresponding to the event memory 60 and event execution unit 47 in FIG. 4) in the tester module 135. The algorithmic test pattern generated by the event generator 154 is supplied to the device under test through the driver 152.

Preferably, the hard disc sub-unit 158 noted above is configured detachably relative to the ALPG module 137. Under this arrangement, the algorithmic pattern data can be written in the hard discs in off-line while using the other sub-units for the ALPG module 137. This is effective in improving the test efficiency of the test system especially when such a test system is used in a production stage of the semiconductor devices. Thus, in a research and development use, the ALPG module 137 may be configured by a type of storage other than a hard disc to produce the event data for algorithmic pattern in real-time.

As in the foregoing, since all of the signals involved in the testing can be processed by the event timing data by incorporating the event based tester modules, the event data for the algorithmic pattern using the hard discs can be implemented in the ALPG module.

Referring back to FIG. 7A, the test result data for the memory device under test is also provided to the repair module 132. The repair module 132 is provided in advance with data concerning the physical structure and rules regarding the use of redundant memory section in the memory device under test. Therefore, based on the test result data, the repair module 132 determines repair algorithm for replacing the defective memory cell with a memory cell in the redundant memory section. As noted above, typically, such replacement of memory cells is conducted by cutting inner circuit patterns of the memory device under test by laser pulses or electric signals. In the case where the pattern cutting is performed by electric signals, by incorporating the repair module 132 having an electric current driver, the test system of the present invention can achieve both testing and repair of the memory device under test.

The example of semiconductor test system shown in FIG. 7B is basically the same as that of FIG. 7A, however, there are small differences. One of the differences is that the memory tester module 135 and the algorithmic pattern generator (ALPG) module 137 are connected through a transfer means such as a data cache pipeline 138. Such high speed data transfer using an advance control technology such as pipelining and paralleling is well known in the art. By properly setting the number of stages (registers) in the pipeline 138, the data transfer rate from the ALPG module 137 to the tester module 135 can be substantially lower than that from the tester module 135 to the device under test. Thus, the ALPG module 137 can be established with low cost.

Another difference resides in that the ALPG module 137 includes a programmable logic device, typically, a field programmable gate array (FPGA) 139 as a sub-unit of the ALPG module 137 or the ALPG module itself. An example of an ALPG configured by such an FPGA will be described later. The data to be loaded in the FPGA sub-unit 139 is converted to a data format corresponding to the format of the FPGA and is written in the FPGA sub-unit 139.

In the foregoing arrangement, an algorithmic pattern specific to a kind of memory device under test can be generated by the FPGA 139 with low cost. The data in the FPGA is written, for example, by HDL (Hardware Description Language). FIG. 7B further shows a case where the event data from the ALPG module 137 or FPGA 139 for generating the algorithmic pattern is produced based on a file 141 in an RTL (register transfer language) model. Such an RTL model file is created by a design engineer of a semiconductor device using a test bench 142, which is generally described by HDL.

As in the foregoing, in the present invention, unlike a conventional ALPG designed for all kinds of algorithmic pattern, an application specific ALPG which can generate an algorithmic pattern only for a specific memory device under test is used for the memory testing. Accordingly, it is able to establish a memory test system of simple structure and low cost. Further, as noted above, when the memory device under test has a repairable memory structure, the test system of the present invention can also accomplish the memory repair process by incorporating the test fixture 127 mounting the repair module 132.

Figure 9:
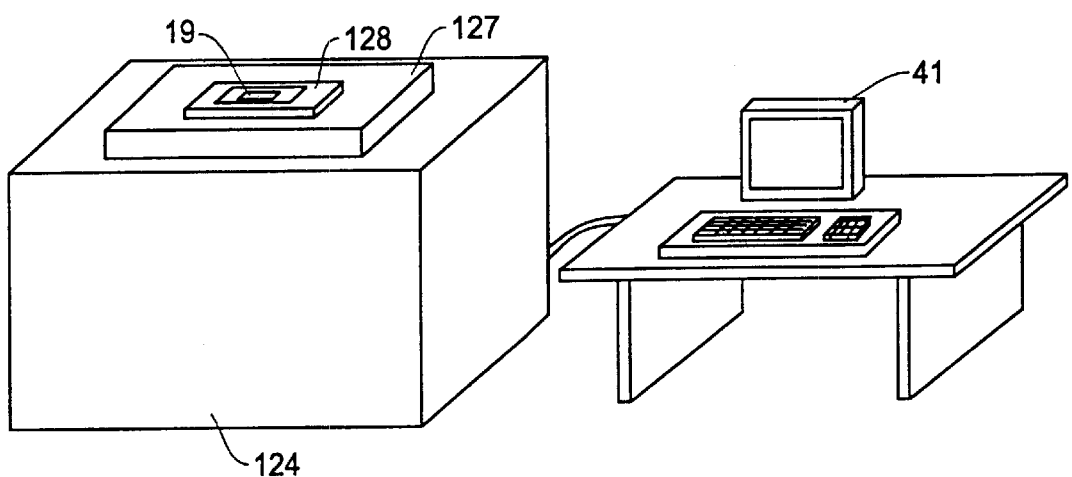
FIG. 9 is a schematic diagram showing an example of outward appearance of the module based semiconductor test system of the present invention.

An example of outer appearance of the semiconductor test system of the present invention is shown in the schematic diagram of FIG. 9. In the example of FIG. 9, a host computer (main system computer) 41 is, for example, a work station having a graphic user interface (GUI). The host computer 41 functions as a user interface as well as a controller to control an overall operation of the test system. The host computer 41 and the inner hardware of the test system are connected through the system bus 64 (FIGS. 4 and 5).

The FPGA sub-unit 139 which is a part of the ALPG module of the present invention will be explained with reference to FIGS. 10–15. The sub-unit 139 of the present invention is a dedicated algorithmic pattern generator for generating only specified algorithmic test patterns by using an FPGA (field programmable gate array), a PLD (programmable logic device), or a PAL (programmable array logic).

The FPGA, PLD, or PAL noted above is a logic IC device capable of being programmed by a user (programmable logic device), where the program by that user is loaded in the IC device to configurate the intended functions in the IC device. Such programmable logic devices used in the present invention are not limited to the nomenclatures such as the FPGA mentioned above, but includes every logic device capable of being programmed by a user.

Figure 10:
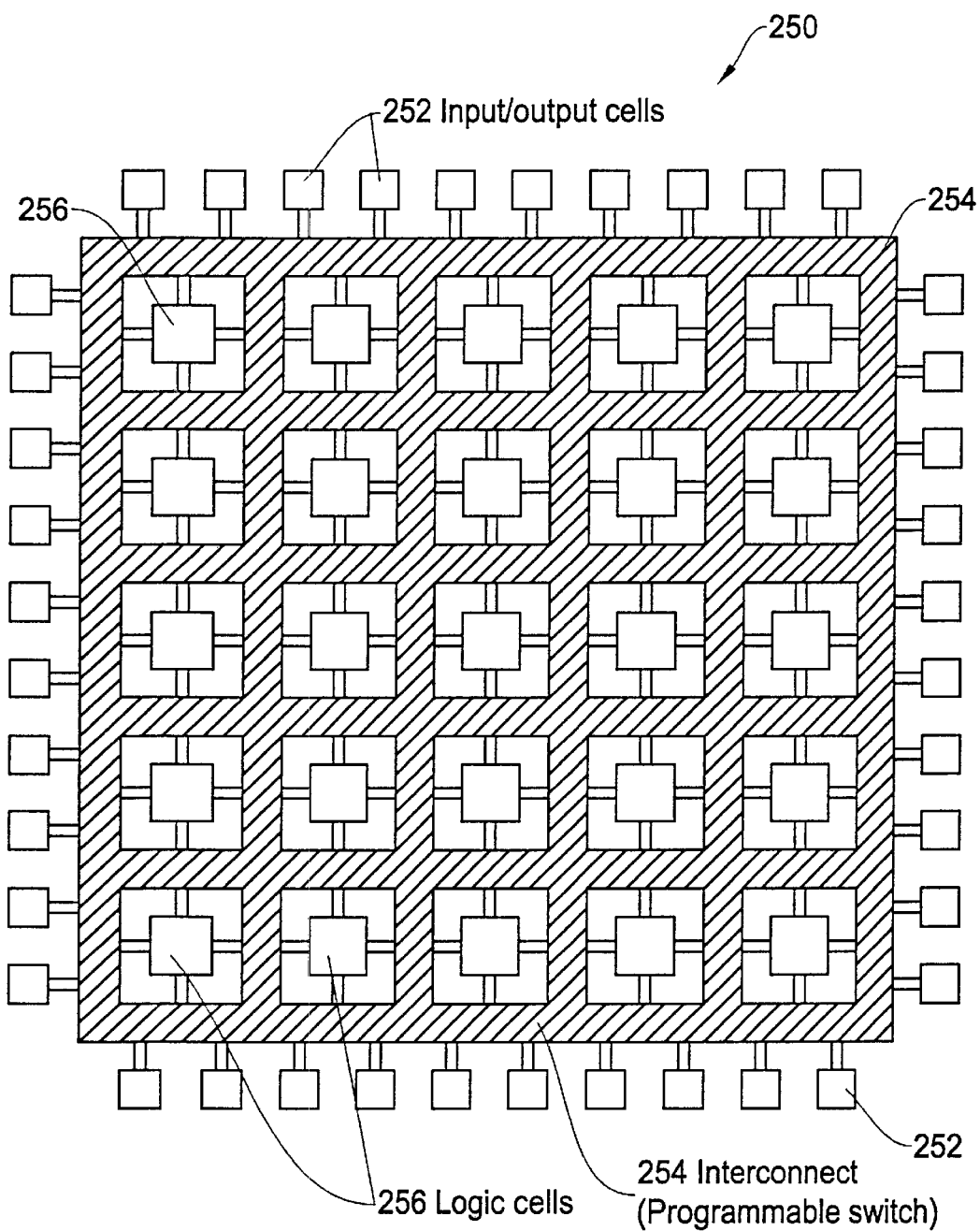
FIG. 10 is a schematic diagram showing a simplified structural example of an FPGA (field programmable gate array) which is one of the kinds of gate arrays used for establishing the algorithmic pattern generator of the present invention.

FIG. 10 shows a basic structural example of the FPGA (field programmable gate array). In an FPGA 250, a large number of logic cells 256, such as several hundreds or several thousands, are arranged in a two-dimensional manner (in array). In each logic cell 256, channels are formed vertically and horizontally, where the input/output signal paths for the logic cells 256 are formed by these channels. These signal paths can be freely connected to other logic cells 256 through interconnects 254 (programmable switches). In the peripheral of the FPGA 250, input/output cells 252 are provided for interfacing with the external circuits.

Figure 11:
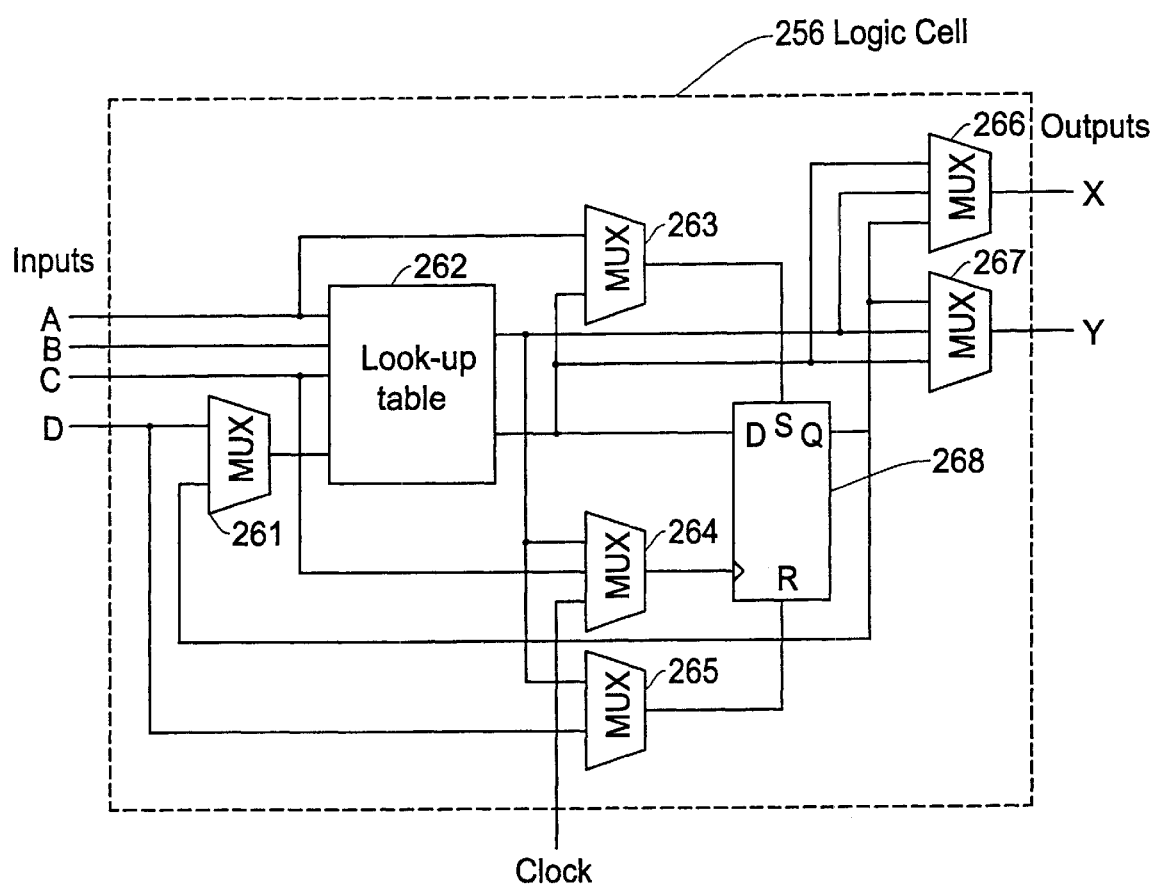
FIG. 11 is a circuit diagram showing an example of basic circuit structure in one of the logic cells in the FPGA of FIG. 10.

The most simplified structural example of each logic cell 256 of the FPGA 250 is shown in FIG. 11. In this example, the logic cell 256 has input terminals A, B, C, D, output terminals X, Y, and a clock terminal, where each terminal operates in synchronism with the clock. The inside of the logic cell 256 is comprised of a plurality of multiplexers (selector circuits) 261 and 263–267, a look-up table 262, and a flip flop 268.

The look-up table 262 is a small memory which is capable of being programmed by a user, where input signals from the above noted input terminals can be used as the addresses of the memory. By programming the look-up table 262, desired logic functions can be fulfilled in a manner similar to a PROM (programmable ROM). Therefore, it can be said that each of the logic cells 256 is a unit structured by logic circuits (formed of gates) and flip flops.

With respect to the programmable switches 254, there is a type of FPGA which is so structured that once the first programming is fixed, no further change is available, or another type of FPGA which is capable of repeatedly changing the program; and both are available in the market. In the case where the FPGA is capable of repeatedly changing the program (rewriting the program), the programmable switch 254 is structured by a transistor switch, and its on and off settings are controlled by external signals.

Figure 12:
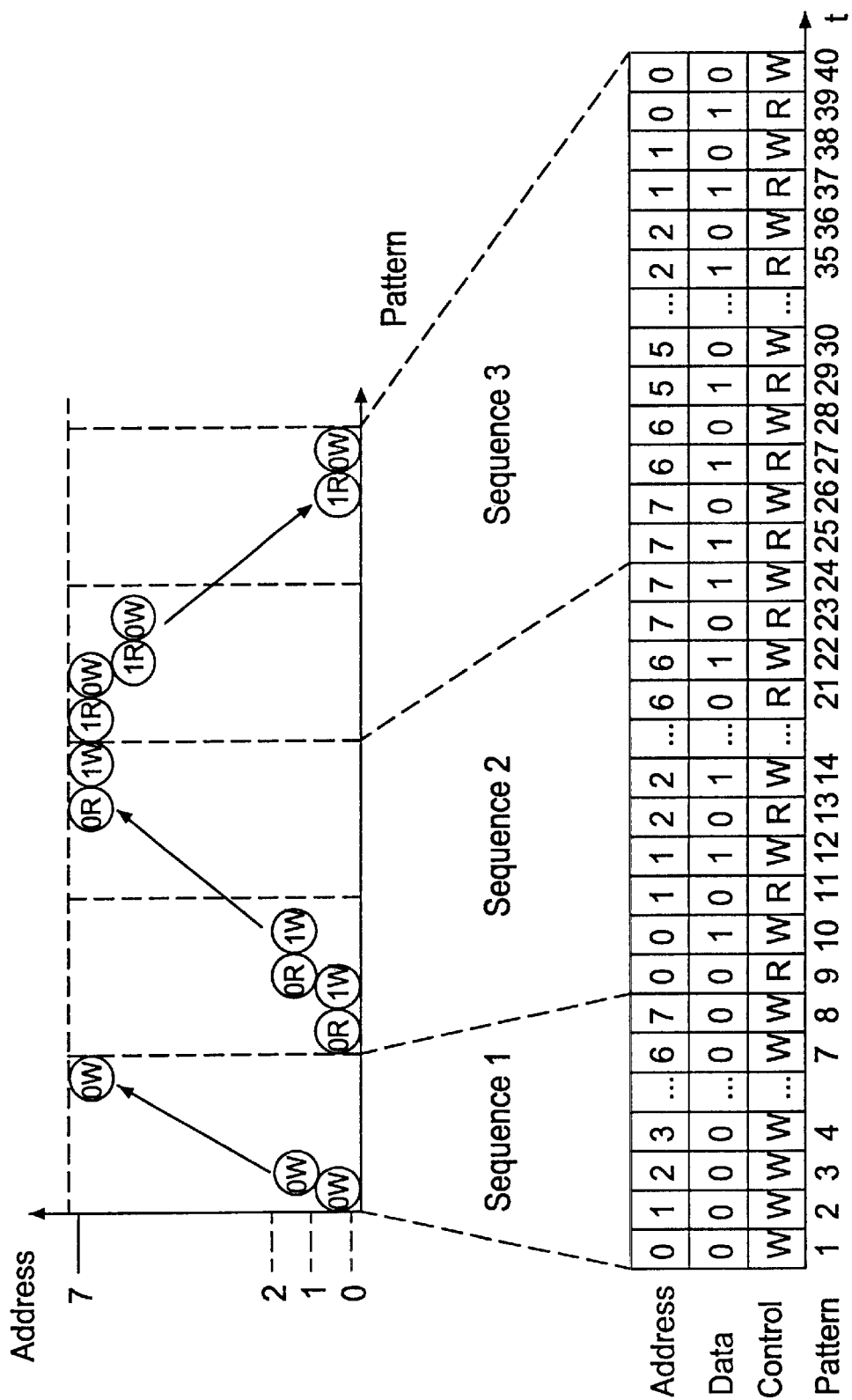
FIG. 12 is a schematic diagram showing an example of sequences in a marching pattern which is one of the types of algorithmic test patterns generated by the pattern generator for testing a semiconductor memory.

FIG. 12 shows a marching pattern, which is one of the typical algorithmic test patterns. In this example, it is assumed that the number of addresses (cell numbers) of the memory under test is only 8 (from address 0 to address 7) to simplify the description. In the upper portion of FIG. 12, the applicable addresses are expressed in a flow graph, where writing 0 in the memory is denoted by "0W", writing 1 is denoted by "1W", and reading 0 from the memory is denoted by "0R", and reading 1 is denoted by "1R", respectively. In the lower portion of FIG. 12, the addresses generated by the address generator, the data generated by the data generator, and the control signals generated by the control signal generator are respectively shown in a table form.

Even if the marching pattern of FIG. 12 is applied to the memory under test with only 8 memory cells, the test pattern requires 40 steps to be generated. Therefore, in order to test today's high density semiconductor memory devices with several hundred megabits, for example, an enormous amount of memory capacity will be necessary to simply store such test patterns in the memory of the pattern generator. Therefore, in the industry, the test pattern having predetermined repetitive sequences is generated by conducting mathematical computations, thereby making the memory capacity required for the pattern generation smaller. Such pattern generators are called an algorithmic pattern generator as mentioned above.

Figure 13:
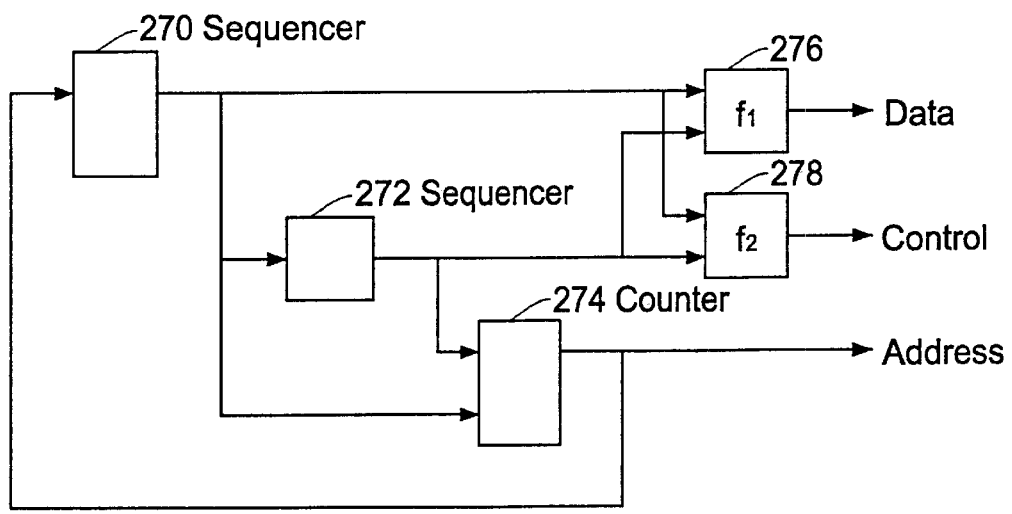
FIG. 13 is a block diagram showing an example of the algorithmic pattern generator of the present invention structured by an FPGA which is constituted to generate the marching pattern of FIG. 12.

FIG. 13 shows an example of an algorithmic pattern generator of the present invention structured by using an FPGA. The algorithmic pattern generator in this example is structured by sequencers and counters configured by an FPGA to generate the marching pattern shown in FIG. 12. This algorithmic pattern generator can be structured by using programmable logic devices other than the FPGA.

The pattern generator in FIG. 13 has sequencers 270 and 272, a counter 274, and logic circuits 276 and 278. The counter 274 is an up/down counter. The logic circuits 276 and 278 achieve gate functions such as AND and OR. The output of the logic circuit 276 is the data, the output of logic circuit 278 is the control signal, and the output of the counter 274 is the address in FIG. 12. These data, control signal, and address configure the marching test pattern of FIG. 12 which is supplied to the memory device under test.

Figure 14A:
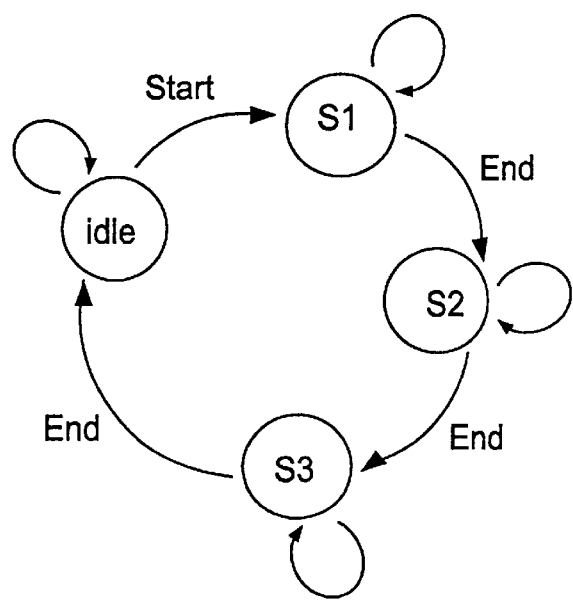
FIGS. 14A and 14B are state diagrams showing the sequences for generating the marching pattern of FIG. 12 based on the algorithmic pattern generator of FIG. 13 structured by the FPGA.
Figure 14B:
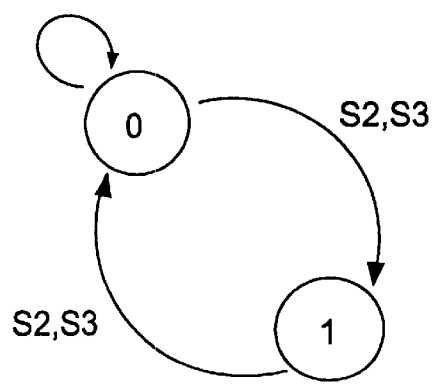

FIGS. 14A and 14B are state diagrams showing the operational sequences of each part of the algorithmic pattern generator of FIG. 13 structured by the FPGA for generating the marching pattern of FIG. 12. FIG. 14A shows the operation of the sequencer 270, and FIG. 14B shows the operation of the sequencer 272.

The counter 274 is programmed to count upward when the condition (state) of the sequencer 270 is either S1 or S2, and to count downward when the state of the sequencer 270 is S3. The counter 274 is also programmed to not operate (pose) when the state of the sequencer 272 is logic 1, and to conduct a count operation when the state of the sequence 272 is logic 0.

In FIG. 14A, when a "start" condition is established in an idle state, the sequencer 270 begins its operation where it transitions to the S1 state (sequence 1). Due to this transition, the counter 274 also begins its operation where the clock is counted upward one by one. As a result, the counter 274 generates the addresses from 0 to 7 (patterns 1–8) shown in FIG. 12.

The sequencer 72 in FIG. 14B repeatedly alternates between logic 0 and logic 1 when the state of the sequencer 270 is either in S2 or S3, however, it is programmed to not operate when the state of the sequence 270 is S1. Thus, the sequencer 272 is inoperable, where it maintains the logic 0. This logic 0 is output from logic circuit 276 as the data, thus, the write data 0 in the patterns 1–8 in FIG. 12 is formed. This logic 0 is also output from the logic circuit 278 as the write control signal (W).

In FIG. 14A, when the sequence 1 of FIG. 12 ends, an end state is established where the sequencer 270 transitions to state S2 (sequence 2). The counter 274, as mentioned above, is set to count upward even when the state of sequencer 270 is in S2. Therefore, the address value increases as shown in the sequence 2 of FIG. 12.

At this time, as shown in FIG. 14B, the sequencer 272 synchronizes with the clock and repeatedly changes between the logic 0 and logic 1 when the state of the sequencer 270 is either in S2 or S3. Since the operation of the counter 274 stops when the state of the sequencer 272 is logic 1 as mentioned above, the address output from the counter 274 maintains the previous state. Therefore, the address output of the counter 274 increases while repeating the same address twice, such as "00112233 . . . " as shown in FIG. 12.

Since the state of the sequencer 272 repeatedly changes between the logic 0 and logic 1, the output of the sequencer 272 is output from the logic circuit 278 as the write control signal (W) and the read control signal (R). The state of the sequencer 272 also outputs logic 0 and logic 1 from the logic circuit 276 as the data shown in FIG. 12.

In FIG. 14A, when the sequence 2 of FIG. 12 ends, an end state is established where the sequencer 270 transitions to state S3 (sequence 3). In the state S3, as mentioned above, the address value decreases from the address 7 to address 0 since the counter 274 downward counts the clock. Since the sequencer 272 at this time repeatedly changes between the logic 0 and logic 1, as explained above, the address output of the counter 74 decreases while repeating the same address twice, such as "77665544 . . . " as shown in FIG. 12.

Further, the state of the sequencer 272 repeatedly changes between the logic 0 and logic 1, which is output from the logic circuit 278 as the write control signal (W) and the read control signal (R), as well as output from the logic circuit 276 as the data. At this time, since the data and control signals (write and read) are opposite to that of the sequence 2, an inverse logic is output from the logic circuits 276 and 278 in, for example, the state S3 of the sequencer 270.

As described in the foregoing, the marching test pattern of FIG. 12 can be generated by the algorithmic pattern generator of FIG. 13. In this manner, by creating an algorithmic pattern generator with a programmable logic device, the exclusive pattern generator sub-unit 139 for specific patterns can be structured with a small scale hardware. Further, since the sub-unit 139 conducts an operation predetermined by the program assembled in the hardware, it does not require times for accessing the memory such as involved in the conventional general purpose pattern generator, and therefore is capable of a high-speed operation.

Figure 15A:
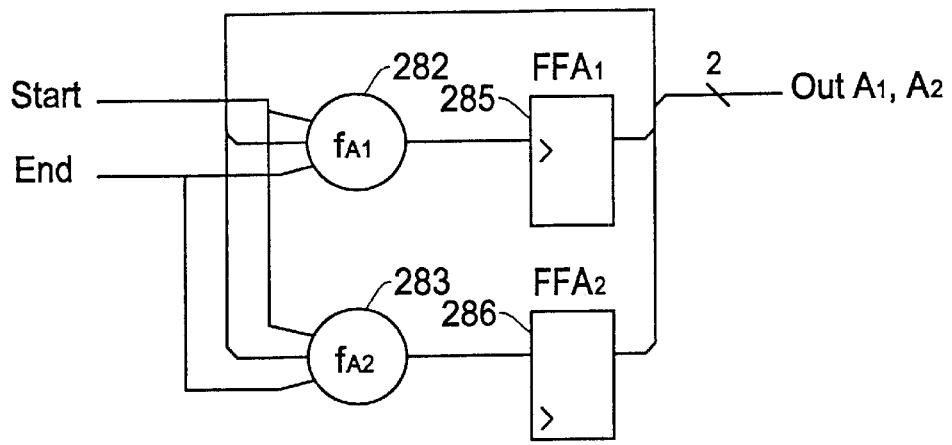
FIG. 15A is a block diagram showing an example of structure in the sequencer 270 shown in FIG. 13.
Figure 15B:
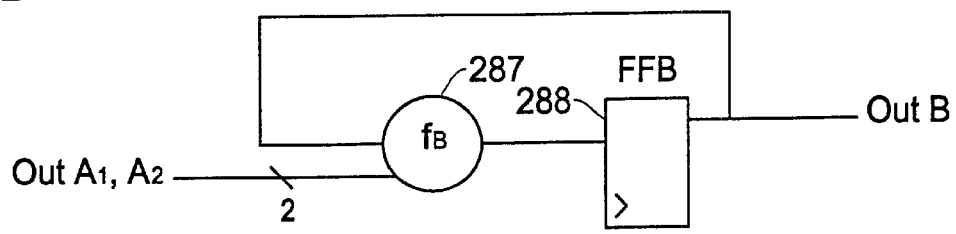
FIG. 15B is a block diagram showing an example of structure in the sequencer 272 of FIG. 13.
Figure 15C:
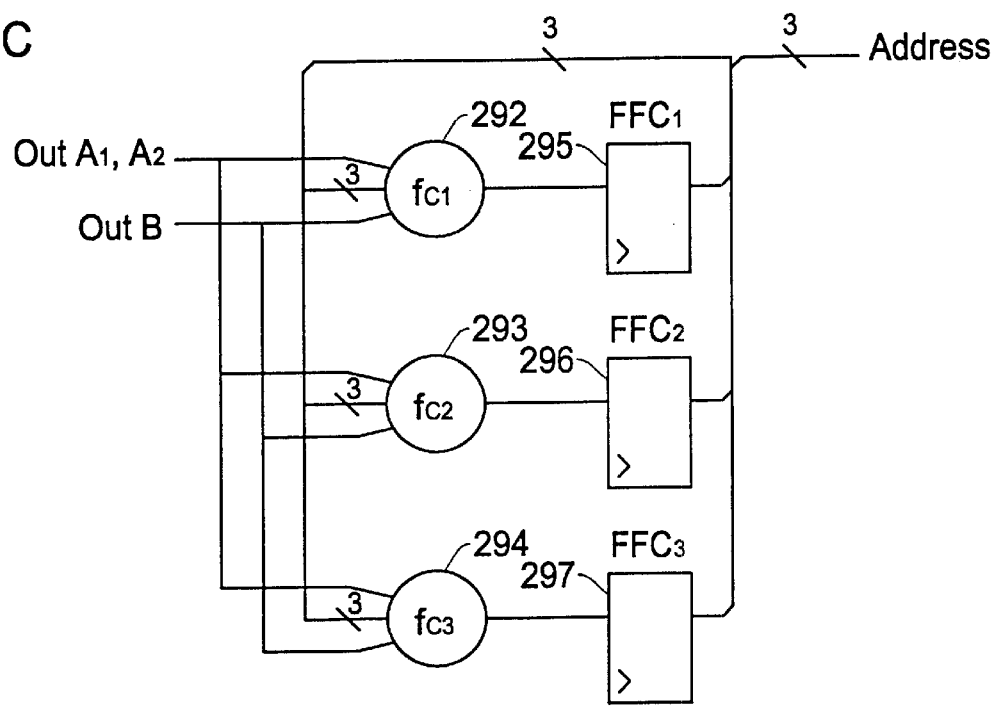
FIG. 15C is a block diagram showing an example of structure in the counter 274 shown in FIG. 13.

FIG. 15A is a block diagram showing a structural example of the sequencer 270 of FIG. 13, FIG. 15B is a block diagram showing a structural example of the sequencer 272 of FIG. 13, and FIG. 15C is a block diagram showing a structural example of the counter 274 of FIG. 13. These circuits are structured by combinations of the logic circuits and the flip flops in the FPGA.

The sequencer 270 in FIG. 15A is a state machine structured with logic circuits 282 and 283 and flip flops 285 and 286. Based on the program set in the FPGA, the logic circuits 285 and 286 are provided with "Start" and "End" as input conditions. Outputs A1 and A2 of the sequencer 270 are respectively provided to the sequencer 272 and the counter 274 of FIGS. 15B and 15C.

The sequencer 272 in FIG. 15B is a state machine structured with a logic circuit 287 and a flip flop 288. The output of the sequencer 270 is provided to the input of the sequencer 272. As explained above, when the sequencer 270 is in the S1 state, the sequencer 272 is set to be inoperable (pose).

The counter 274 in FIG. 15C is structured with logic circuits 292, 293 and 294 and flip flops 295, 296 and 297. The output of the counter 274 is the address provided to the memory under test. When the output from the sequencer 272 is in logic 1, the counting operation of the counter 274 becomes inoperable (pose).

The marching test pattern in the above explanation is used just as an example, however, the algorithmic pattern generator of the present invention can be reconfigured to generate other type of algorithmic pattern when a reprogrammable logic device is used, since the program in such FPGA can be changed.

Typically, the FPGA program is conducted by using hardware description language (ex. VHDL, etc.). Therefore, the pattern generator of the present invention can be programmed by using the existing VHDL tools. However, since general purpose algorithmic pattern generators structured to generate various algorithmic patterns already exist, FPGA programming can be performed by creating a compiler for converting the existing programs of the general purpose pattern generator into the FPGA programs. In this way, the program resources in the existing general purpose pattern generator can be effectively utilized.

As explained above, by forming the algorithmic pattern generator of the present invention with a programmable logic device, a dedicated pattern generator for generating only the specific test patterns can be structured by a small scale hardware. Further, since the algorithmic pattern generator of the present invention conducts a predetermined operation by the program assembled in the hardware, time to access the memory that is required in the conventional general purpose pattern generator is no longer required. Therefore, the pattern generator of the present invention can operate at high-speed. In addition, by using a programmable logic device capable of repeatedly writing the programs, the algorithmic pattern generator of the present invention can be reconfigured to change the algorithmic patterns to be generated by changing the hardware program.

The event based test system of the present invention does not need the pattern generator and the timing generator used in the conventional semiconductor test system configured by the cycle based concept. Therefore, it is possible to substantially decrease the physical size of the overall test system by installing all of the modular event testers in the test head (or tester main frame) 124.

As has been foregoing, the semiconductor memory test system of the present invention utilizes the ALPG module which is designed to generate only the algorithmic pattern necessary for the specific memory device or test purpose. Accordingly, in the present invention, various combinations of tester module and ALPG module can be selectively formed, thereby establishing a low cost test system which is specific to an intended memory device under test.

In the semiconductor memory test system of the present invention, the function module is provided in the test fixture which electrically connects the tester module and the device under test, and such a test fixture is replaced with other test fixture based on the device to be tested or intended purpose. The tester module consists of a plurality of tester boards where, under the control of the host computer, each tester board provides a test pattern to a corresponding device pin and evaluates a response output of the device under test.

In the event based memory test system of the present invention, the function module exclusively designed for specific application is installed in the test fixture (pin fixture). Thus, the test system can achieve the function which is specific to the memory device under test as well as the function which is associated with the test result, such as the repair of the memory cells in the memory device under test. As a consequence, by replacing the test fixture depending on the memory device under test, a semiconductor memory test system of simple structure and low cost can be achieved.

In the semiconductor memory test system of the present invention, each test pin can operate independently from the other. Thus, two or more test pin groups can perform test for different devices or different blocks in the device in parallel at the same time. Accordingly, a plurality of different functional blocks (cores) in a system-on-chip IC, such as a logic core and a memory core, can be tested in parallel at the same time.

Since the semiconductor test system of the present invention has a modular structure, a desired test system can be formed freely depending on the kind of devices to be tested and the purpose of the test. Further, the hardware of the event based test system can be dramatically reduced while the software for the test system can be dramatically simplified. Accordingly, the tester modules of different capabilities and performances can be installed together in the same test system. Furthermore, an overall physical size of the event based test system can be considerably reduced, resulting in further cost reduction, floor space reduction and associated cost savings.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A semiconductor test system, comprising:
 a plurality of tester modules whose performances are identical to or different from one another;
 an algorithmic pattern generator (ALPG) module for generating an algorithmic pattern which is specific to a memory in a device under test, said ALPG module being formed of a programmable logic device wherein at least one state machine is configured by applying a hardware based program thereto, thereby enabling to generate the specified algorithmic test pattern;

a test system main frame for accommodating an arbitrary combination of the tester modules and the ALPG module therein;

a test fixture provided on the test system main frame for electrically connecting the tester modules and a device under test;

a performance board provided on the test fixture for mounting the device under test; and a host computer for controlling an overall operation of the semiconductor test system.

2. A semiconductor test system as defined in claim 1, wherein, when the device under test includes a logic function and a memory function, the plurality of tester modules include a logic tester module for logic testing and a memory tester module for memory testing of the device under test, thereby performing the logic testing and memory testing in parallel at the same time.

3. A semiconductor test system as defined in claim 2, wherein the ALPG module transfers event data for generating an algorithmic pattern to the memory tester module through data transfer means formed of a pipeline.

4. A semiconductor test system as defined in claim 1, further comprising a function module installed in the test fixture and specifically designed for a function of the memory in the device under test.

5. A semiconductor test system as defined in claim 3, wherein the function module is a memory repair module for determining a repair algorithm for executing a memory repair process in the memory.

6. A semiconductor test system as defined in claim 1, wherein the ALPG module is comprised of a field programmable gate array (FPGA).

7. A semiconductor test system as defined in claim 1, wherein specification for connecting the test fixture and the tester module is standardized.

8. A semiconductor test system as defined in claim 1, wherein a number of tester pins is variably assigned to the tester module.

9. A semiconductor test system as defined in claim 1, wherein a number of tester pins is variably assigned to the tester module, and such assignment of test pins and modification thereof are regulated by address data from the host computer.

10. A semiconductor test system as defined in claim 1, wherein each of the tester modules includes a plurality of event tester boards where each of the event tester boards is assigned to a predetermined number of test pins.

11. A semiconductor test system as defined in claim 10, wherein each of the tester modules includes a plurality of event tester boards wherein each of the event tester boards includes an inner controller where the inner controller controls to generate a test pattern from the tester module and to evaluate an output signal of the device under test in response to instructions from the host computers.

12. A semiconductor test system as defined in claim 1, wherein each of the tester modules includes an inner controller wherein the inner controller generates a test pattern from the tester module and evaluates an output signal of the device under test in response to instructions from the host computer.

13. A semiconductor test system as defined in claim 1, wherein each of the tester modules includes a plurality of event tester boards where each of the event tester boards is assigned to one of test pins, wherein each of the event tester boards is comprised of:

a controller which controls, in response to instructions from the host computer, to generate the test pattern from the tester module and to evaluate an output signal of the device under test;

an event memory for storing timing data for each event;

an address sequencer for providing, under the control of the controller, address data to the event memory;

means for producing a test pattern based on the timing data from the event memory; and a driver/comparator for transferring the test pattern to a corresponding pin of the device under test and receiving a response output signal from the device under test.

14. A semiconductor test system, comprising:

a plurality of tester modules whose performances are identical to or different from one another;

an algorithmic pattern generator (ALPG) module for generating an algorithmic pattern which is specific to a memory in a device under test, said ALPG module being formed of a programmable logic device wherein at least one state machine is configured by applying a hardware based program thereto, thereby enabling to generate the specified algorithmic test pattern;

a test system main frame for accommodating an arbitrary combination of the tester modules and the ALPG module therein;

a test fixture provided on the test system main frame for electrically connecting the tester modules and a device under test;

a function module provided in the test fixture for performing a function associated with a property of the memory in the device under test;

a performance board provided on the test fixture for mounting the device under test; and a host computer for controlling an overall operation of the test system.

* * * * *